(12) United States Patent
Chuan et al.

(10) Patent No.: US 8,089,075 B2
(45) Date of Patent: Jan. 3, 2012

(54) LFCC PACKAGE WITH A REFLECTOR CUP SURROUNDED BY A SINGLE ENCAPSULANT

(75) Inventors: Ng Keat Chuan, Desaria (MY); Yong Lig Yi, Simpang Ampat (MY); Keh Kean Loo, Gelugor (MY); Tan Kheng Leng, Gelugor (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 50 days.

(21) Appl. No.: 12/426,104

(22) Filed: Apr. 17, 2009

(65) Prior Publication Data
US 2010/0264436 A1 Oct. 21, 2010

(51) Int. Cl.
*H01L 33/00* (2010.01)
(52) U.S. Cl. .......... 257/81; 257/79; 257/89; 257/98; 257/99; 257/433; 257/666; 257/675; 257/676; 257/678; 257/684; 257/692; 257/724; 257/730; 257/731; 257/E21.499
(58) Field of Classification Search ............ 257/98–100
See application file for complete search history.

(56) References Cited

U.S. PATENT DOCUMENTS

| | | | |
|---|---|---|---|
| 5,444,726 A * | 8/1995 | Kitamura et al. | 372/36 |
| 5,614,735 A * | 3/1997 | Kitamura et al. | 257/99 |
| 5,825,794 A * | 10/1998 | Ogino et al. | 372/36 |
| 6,061,160 A * | 5/2000 | Maruyama | 398/201 |
| 6,335,548 B1 * | 1/2002 | Roberts et al. | 257/98 |
| 6,344,689 B1 * | 2/2002 | Suzuki et al. | 257/731 |
| 6,345,903 B1 * | 2/2002 | Koike et al. | 362/241 |
| 6,355,946 B1 * | 3/2002 | Ishinaga | 257/98 |
| 6,376,902 B1 * | 4/2002 | Arndt | 257/678 |
| 6,407,411 B1 * | 6/2002 | Wojnarowski et al. | 257/99 |
| 6,486,543 B1 * | 11/2002 | Sano et al. | 257/684 |
| 6,603,148 B1 * | 8/2003 | Sano et al. | 257/98 |
| 6,621,223 B1 * | 9/2003 | Hen | 315/56 |
| D494,938 S * | 8/2004 | Kamada | D13/182 |
| 6,809,261 B1 * | 10/2004 | Ng et al. | 174/551 |
| 6,830,496 B2 * | 12/2004 | Lin et al. | 445/49 |
| 6,849,867 B2 | 2/2005 | Roberts | |
| 6,862,305 B2 * | 3/2005 | Nishiyama | 372/36 |
| 6,879,040 B2 * | 4/2005 | Ng et al. | 257/730 |
| 6,914,267 B2 * | 7/2005 | Fukasawa et al. | 257/98 |

(Continued)

FOREIGN PATENT DOCUMENTS
WO WO 2007/000037 1/2007

OTHER PUBLICATIONS
High-Brightness LED Technology-Review.

(Continued)

*Primary Examiner* — Minh-Loan T. Tran
*Assistant Examiner* — William Harriston (57) ABSTRACT

In an embodiment, the invention provides a LFCC package comprising first, second and third lead frames, a light source, and an encapsulant. The first lead frame comprises two tongues and a reflector cup. The first, second and third lead frames are attached to the encapsulant. The light source is mounted at the bottom of the inside of the reflector cup. The light source is electrically connected to the second and third lead frames by wire bonds. The reflector cup is surrounded on at least four sides by the encapsulant, the encapsulant being an integral single piece structure.

20 Claims, 9 Drawing Sheets

U.S. PATENT DOCUMENTS

| | | | |
|---|---|---|---|
| 6,943,433 B2 * | 9/2005 | Kamada | 257/666 |
| D511,331 S * | 11/2005 | Horinouchi et al. | D13/182 |
| 7,030,423 B2 * | 4/2006 | Chang et al. | 257/98 |
| 7,183,588 B2 * | 2/2007 | Chia et al. | 257/99 |
| 7,211,882 B2 * | 5/2007 | Wang et al | 257/678 |
| 7,238,967 B2 * | 7/2007 | Kuwabara et al. | 257/98 |
| 7,242,033 B2 * | 7/2007 | Isokawa et al. | 257/99 |
| 7,253,448 B2 * | 8/2007 | Roberts et al. | 257/99 |
| 7,282,740 B2 * | 10/2007 | Chikugawa et al. | 257/79 |
| 7,335,522 B2 * | 2/2008 | Wang et al. | 438/26 |
| D563,333 S * | 3/2008 | Kim | D13/180 |
| 7,365,407 B2 * | 4/2008 | Ng et al. | 257/433 |
| 7,385,227 B2 * | 6/2008 | Mok et al. | 257/98 |
| 7,435,143 B2 | 10/2008 | Anderlini | |
| 7,462,870 B2 * | 12/2008 | Nakashima | 257/81 |
| 7,499,288 B2 * | 3/2009 | Tanaka et al. | 361/767 |
| 7,528,414 B2 * | 5/2009 | Huang et al. | 257/79 |
| 7,595,549 B2 * | 9/2009 | Kamikawa et al. | 257/676 |
| 7,635,915 B2 * | 12/2009 | Xie et al. | 257/692 |
| 7,655,958 B2 * | 2/2010 | Sanmyo | 257/99 |
| 7,663,199 B2 * | 2/2010 | Lee et al. | 257/433 |
| 7,675,145 B2 * | 3/2010 | Wong et al. | 257/676 |
| 7,709,754 B2 * | 5/2010 | Doogue et al. | 174/528 |
| 2002/0004251 A1 * | 1/2002 | Roberts et al. | 438/26 |
| 2003/0001166 A1 * | 1/2003 | Waalib-Singh et al. | 257/98 |
| 2003/0168720 A1 * | 9/2003 | Kamada | 257/666 |
| 2004/0052077 A1 * | 3/2004 | Shih | 362/294 |
| 2004/0227149 A1 | 11/2004 | Ibbetson | |
| 2004/0256706 A1 * | 12/2004 | Nakashima | 257/678 |
| 2005/0077623 A1 * | 4/2005 | Roberts et al. | 257/724 |
| 2005/0133810 A1 * | 6/2005 | Roberts et al. | 257/99 |
| 2005/0242708 A1 * | 11/2005 | Keong et al. | 313/498 |
| 2005/0263784 A1 * | 12/2005 | Yaw et al. | 257/98 |
| 2005/0269587 A1 * | 12/2005 | Loh et al. | 257/99 |
| 2006/0054912 A1 * | 3/2006 | Murakami et al. | 257/99 |
| 2006/0175716 A1 * | 8/2006 | Nakashima | 257/787 |
| 2006/0186428 A1 | 8/2006 | Tan | |
| 2006/0226435 A1 * | 10/2006 | Mok et al. | 257/98 |
| 2006/0267036 A1 * | 11/2006 | Lee et al. | 257/98 |
| 2007/0034886 A1 | 2/2007 | Wong | |
| 2007/0063321 A1 * | 3/2007 | Han et al. | 257/675 |
| 2007/0081313 A1 * | 4/2007 | Tanaka et al. | 361/767 |
| 2007/0181901 A1 * | 8/2007 | Loh | 257/99 |
| 2007/0257272 A1 | 11/2007 | Hutchins | |
| 2008/0079019 A1 * | 4/2008 | Huang et al. | 257/99 |
| 2008/0191235 A1 * | 8/2008 | Wang et al. | 257/99 |
| 2008/0224162 A1 * | 9/2008 | Min et al. | 257/98 |
| 2008/0258162 A1 * | 10/2008 | Koung et al. | 257/98 |
| 2008/0273340 A1 * | 11/2008 | Ng et al. | 362/373 |
| 2008/0290352 A1 * | 11/2008 | Park | 257/89 |
| 2009/0032829 A1 * | 2/2009 | Chew et al. | 257/98 |
| 2009/0283781 A1 * | 11/2009 | Chan et al. | 257/89 |
| 2010/0072506 A1 * | 3/2010 | Bae et al. | 257/99 |
| 2010/0072592 A1 * | 3/2010 | Yong et al. | 257/676 |
| 2010/0133560 A1 * | 6/2010 | Kim et al. | 257/89 |

OTHER PUBLICATIONS

Richard Wilson, LED Packaging Gets Clever, Electronicsweekly, Apr. 19, 2005, 3 pages.

\* cited by examiner

LFCC PACKAGE WITH A REFLECTOR CUP SURROUNDED BY A SINGLE ENCAPSULANT

BACKGROUND

Light emitting diodes (LEDs) have many advantages over conventional light sources, such as incandescent, halogen and fluorescent lamps. These advantages include longer operating life, lower power consumption and smaller size. Consequently, conventional light sources are increasingly being replaced with LEDs in traditional lighting applications. As an example, LEDs are currently being used in flashlights, traffic signal lights, automotive taillights and display devices.

Among the various packages for LEDs, an LED package of interest is the plastic leaded chip carrier (PLCC) package for a surface mount LED. Surface mount LEDs in PLCC packages may be used, for example, in automotive interior display devices, electronic signs and signals, and electrical equipment.

A concern with the current process for producing PLCC packages is the problem of thermal expansion between different materials used in PLCC packages. Because materials expand and contract differently, thermal stress is created between different materials. A coefficient of thermal expansion (CTE) is often used to characterize how different materials expand or contract with changes in temperature.

Thermal stress may initiate mini cracks along interfacial surfaces. Thermal stress may also cause de-lamination between a die and a lead frame for example. Thermal cycling conditions (i.e. repeated changes in temperature) that occur during normal operation may propagate mini cracks to the extent a die that is attached to a lead frame may be lifted from the lead frame.

Silicone is commonly used as a material to encapsulate a light source in a PLCC because it is soft and pliable. Because silicone is soft and pliable, it is often used to reduce cracks in a PLCC package.

DETAILED DESCRIPTION

The drawings and description, in general, disclose a LFCC (Lead Frame Chip Carrier) package 400 containing a reflector cup 202 in which four sides (210, 212, 106 and 208) of the reflector cup 202 are covered in an encapsulant 302; the encapsulant 302 being an integral single piece structure. In one exemplary embodiment, the reflector cup 202 is fashioned, for example by stamping, on a first lead frame 102. The first lead frame 102 is attached to the encapsulant 302 via first 204 and second 206 tongues. A second lead frame 104 and a third lead frame 108 are also attached to the encapsulant 302.

In this embodiment, a light source 502, for example an LED, is physically connected at the bottom of the reflector cup 202. A laser may also be used as a light source 502. In this exemplary embodiment, a first wire bond 506 is connected to the light source 502 and the second lead frame 104. In this exemplary embodiment, a second wire bond 504 is connected to the light source 502 and the third lead frame 108.

The second 104 and third 108 lead frames provide electrical connections for the light source 502 as well as leads for mounting. In this exemplary embodiment, the second 104 and third 108 lead frames also function as heat sinks to dissipate heat created by the light source 502.

After the light source 502 is mounted to the first lead frame 102 and electrically connected to the second 104 and third 108 lead frames, an encapsulant 302 is formed around the first 102, second 104 and third 108 lead frames, the wire bonds 506 and 504, and the light source 502. Forming the encapsulant 302 around the first 102, second 104 and third 108 lead frames, the wire bonds 506 and 504, and the light source 502 covers four sides (208, 210, 212 and 106) of the reflector cup 202. In an exemplary embodiment, after forming the encapsulant 302 around the first 102, second 104 and third 108 lead frames, the wire bonds 506 and 504, and the light source 502, an optical lens (not shown) may be added by standard methods. An optical lens includes but is not limited to a fresnel oval and a bolster lens. In addition, an optical lens (not shown) may be formed as an integral part of the encapsulant 302.

Because the encapsulant 302 covers four sides (208, 210, 212 and 106) of the reflector cup 202 and there is only a single encapsulant, there can be no CTE mismatch between the encapsulant 302 and a plastic structural body for example. Because there is no CTE mismatch between the encapsulant 302 and a plastic structural body, the occurrence of de-lamination between the light source 502 and the first lead frame 102 is less likely. Also, because the encapsulant 302 covers four sides (208, 210, 212 and 106) of the reflector cup 202 the occurrence of de-lamination between the light source 502 and the first lead frame 102 due to a CTE mismatch between the encapsulant 302 and any of the lead frames 102, 104 and 108, will be less likely.

The first 204 and second 206 tongues that are an integral part of the first lead frame 102. The first 204 and the second 206 tongues are substantially rigid to reduce movement of the reflector cup 202. Reducing the movement of the reflector cup 202 lowers the probability of the wire bonds 504 and 506 separating from either the light source 502 or the second 104 and third lead 108 frames. When either of the wire bonds 504 and 506 separate from either the light source 502 or the second 104 and third 108 lead frames, the electrical connection is opened and the light source 502 will not function.

Figure 1:
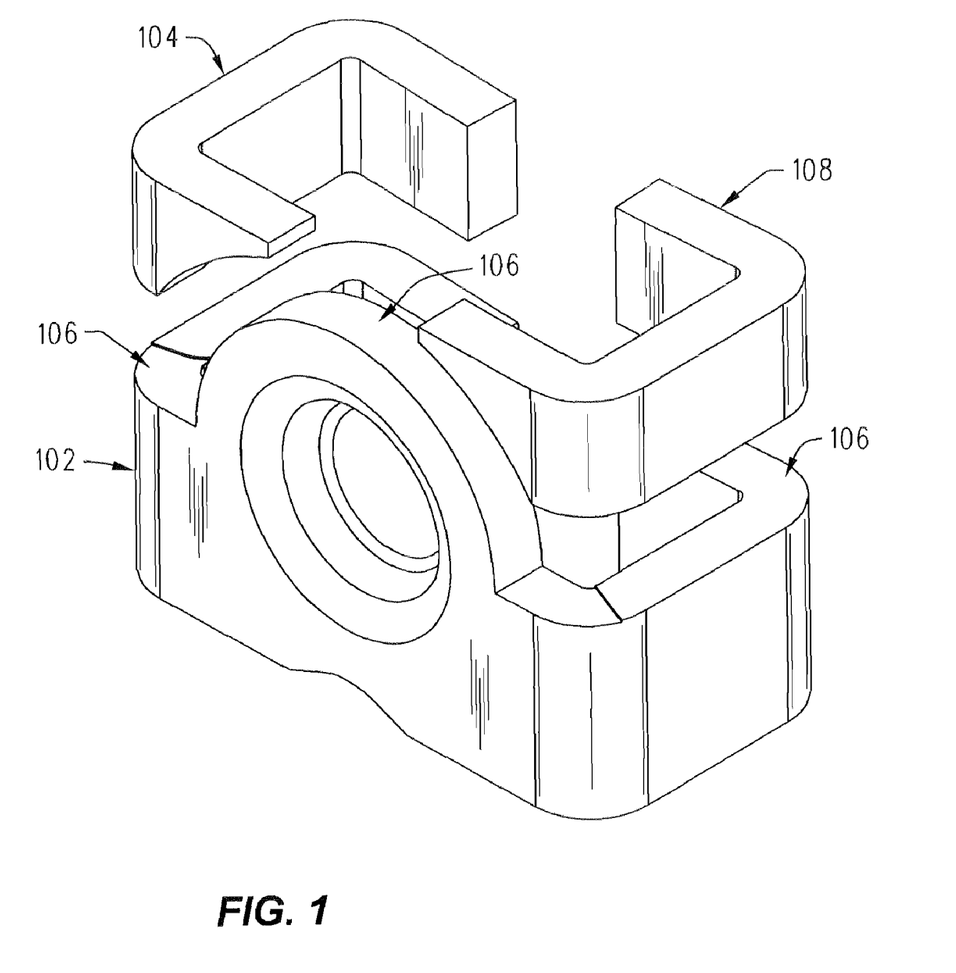
FIG. 1 is an isometric drawing of first, second and third lead frames in accordance with an exemplary embodiment of the invention.

FIG. 1 is an isometric drawing of a first lead frame 102, a second lead frame 104 and a third lead frame 108 in accordance with an exemplary embodiment of the invention. In this exemplary embodiment, the first lead frame 102, the second lead frame 104 and the third lead frame 108 have J-leads. However, it is anticipated that other leads such as SOJ leads, gull wing leads, reverse gull wing leads and straight cut leads may be used in other embodiments of this invention. One side 106 of the reflector cup 202 is also shown in FIG. 1.

Figure 2A:
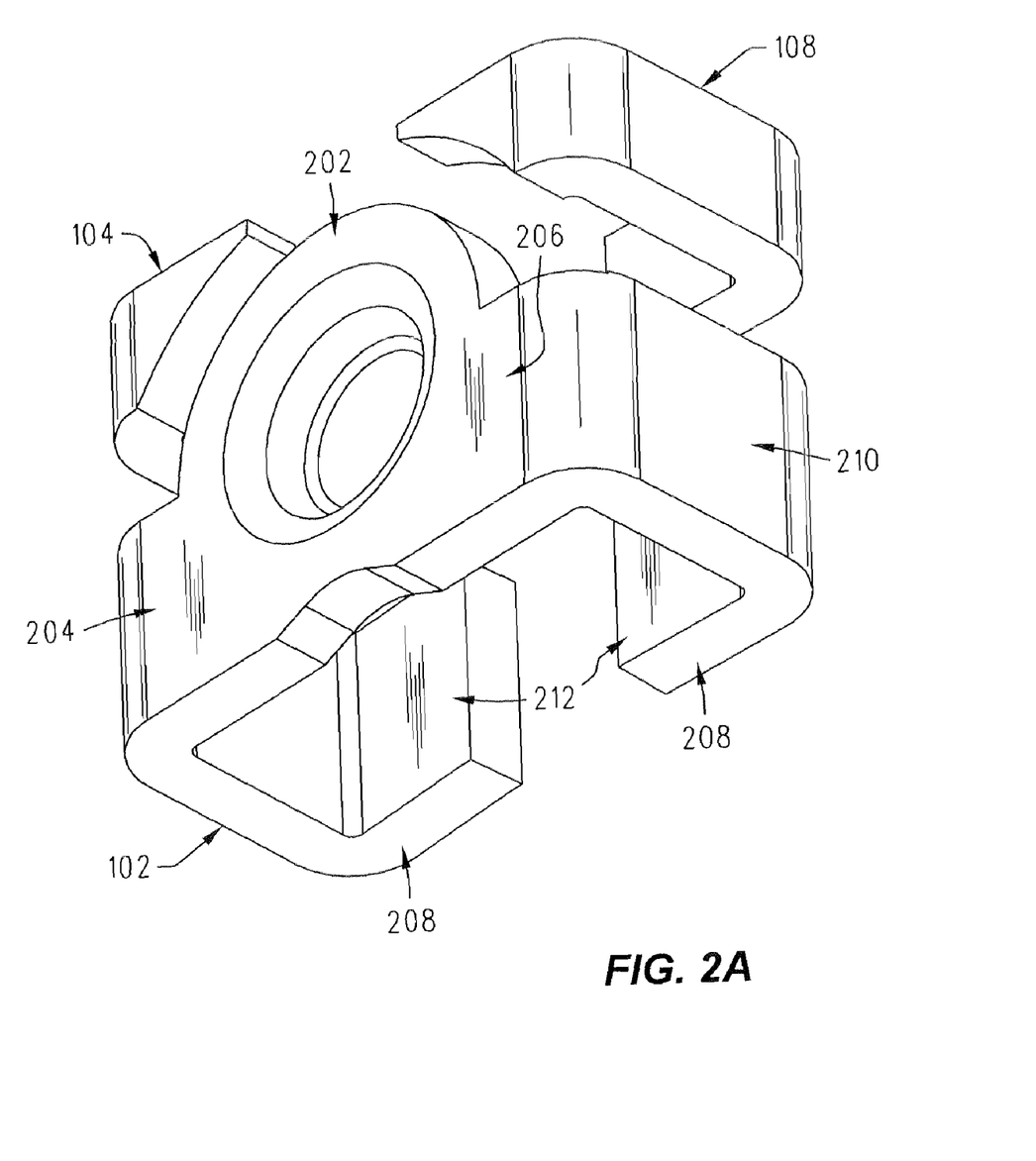
FIG. 2A is an isometric drawing of first, second and third lead frames in accordance with an exemplary embodiment of the invention.

FIG. 2A is an isometric drawing of a first lead frame 102, second lead frame 104 and a third lead frame 108 in accordance with an exemplary embodiment of the invention. In this exemplary embodiment, the first lead frame comprises a first tongue 204, a second tongue 206, and a reflector cup 202. Three sides (208, 210 and 212) of the reflector cup 202 are also shown in FIG. 2A. The reflector cup 202 may be formed by standard methods, for example by stamping the first lead frame 102. As will be discussed in more detail, the reflector cup 202, is surrounded on four sides (208, 210, 212 and 106) of the reflector cup 202 by an encapsulant 302.

The first 204 and second 206 tongues in this exemplary embodiment are substantially rigid so as to reduce movement of the reflector cup 202. Reducing movement of the reflector cup 202, among other things, reduces the probability that an electrical connection between the reflector cup 202 and the second 104 and third lead 108 frames will be open. In this exemplary embodiment, if either electrical connection between the reflector cup 202 and the second lead frame 104 and the third lead frame 108 are open, the light source 502 will not function. In this exemplary embodiment the electrical connections are made by wire bonds 506 and 504.

Figure 2B:
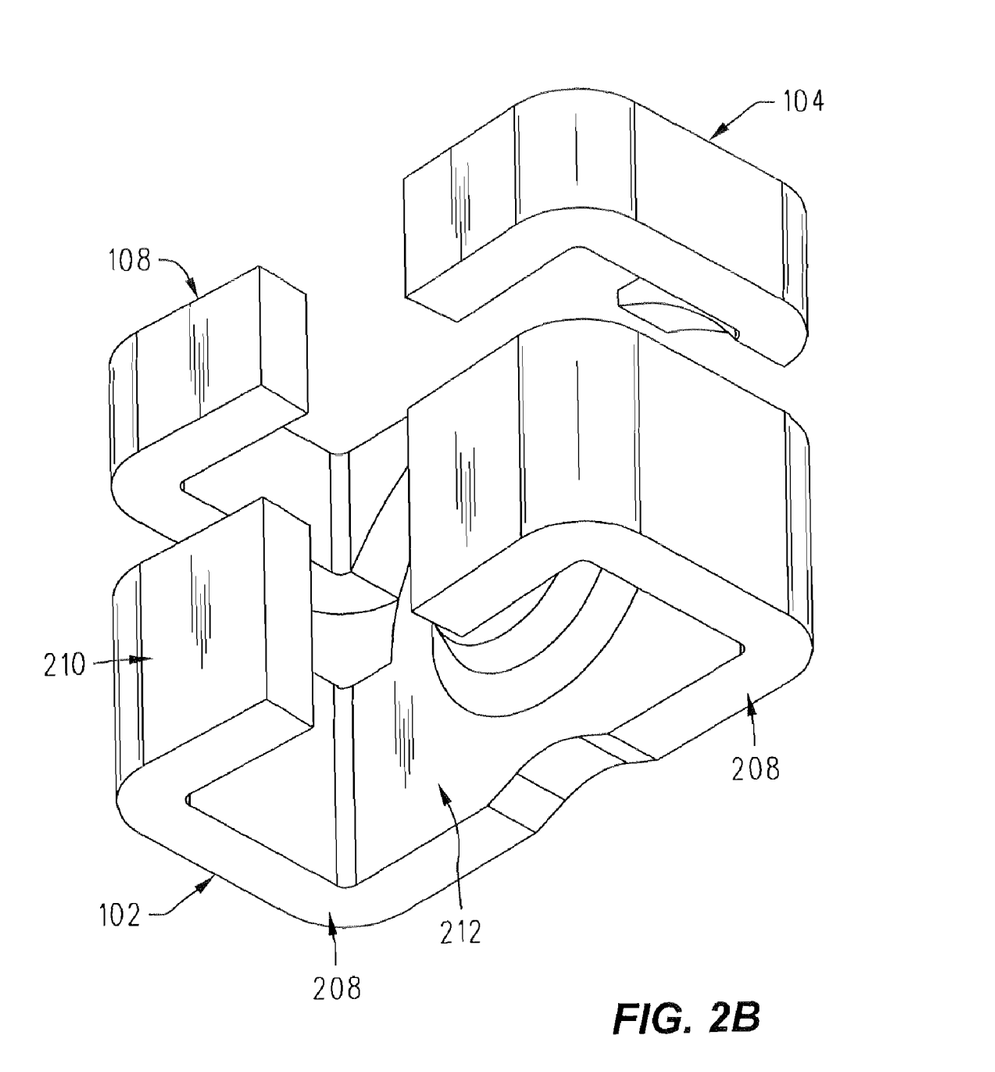
FIG. 2B is an isometric drawing of first, second and third lead frames in accordance with an exemplary embodiment of the invention.

FIG. 2B is a third isometric drawing of a first lead frame 102, a second lead frame 104 and a third lead frame 108 in accordance with an exemplary embodiment of the invention. In this exemplary embodiment, the first lead frame comprises a first tongue 204, a second tongue 206, and a reflector cup 202. Three sides 208, 210 and 212 of the reflector cup 202 are shown in FIG. 2B. As will be discussed in more detail, the reflector cup 202, is surrounded on four sides (208, 210, 212 and 106) by an encapsulant 302.

Figure 3:
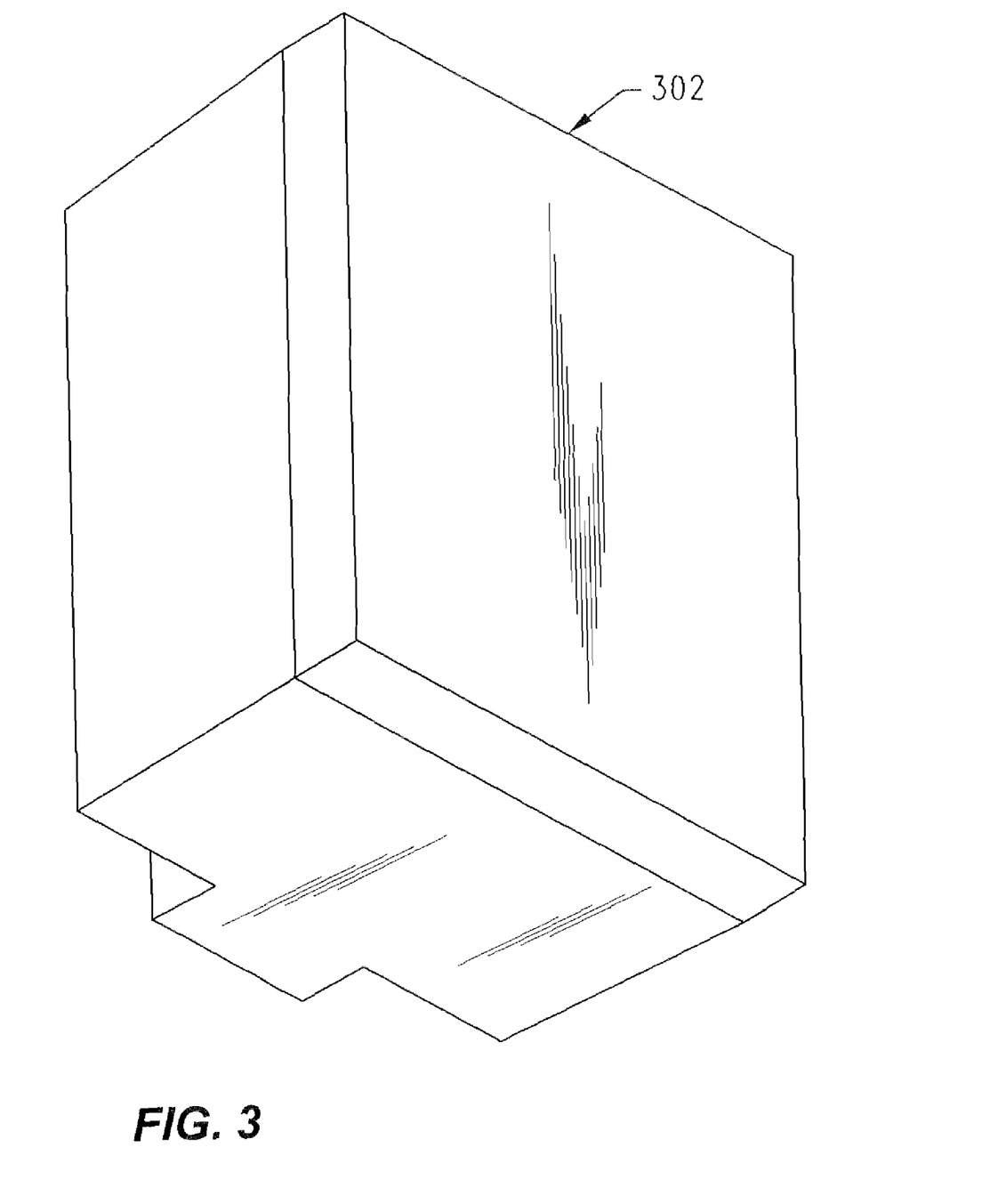
FIG. 3 is an isometric drawing of a single encapsulant in accordance with an exemplary embodiment of the invention.

FIG. 3 is an isometric drawing of a single encapsulant 302 in accordance with an exemplary embodiment of the invention. In this exemplary embodiment, the single encapsulant 302 may be an integral single piece structure. In a second embodiment the single encapsulant 302 may have dimensions that conform to the PLCC-4 standard. The encapsulant 302 may be formed using any standard process. For example, injection molding transfer molding and compression molding may be used to form the encapsulant 302.

Figure 4:
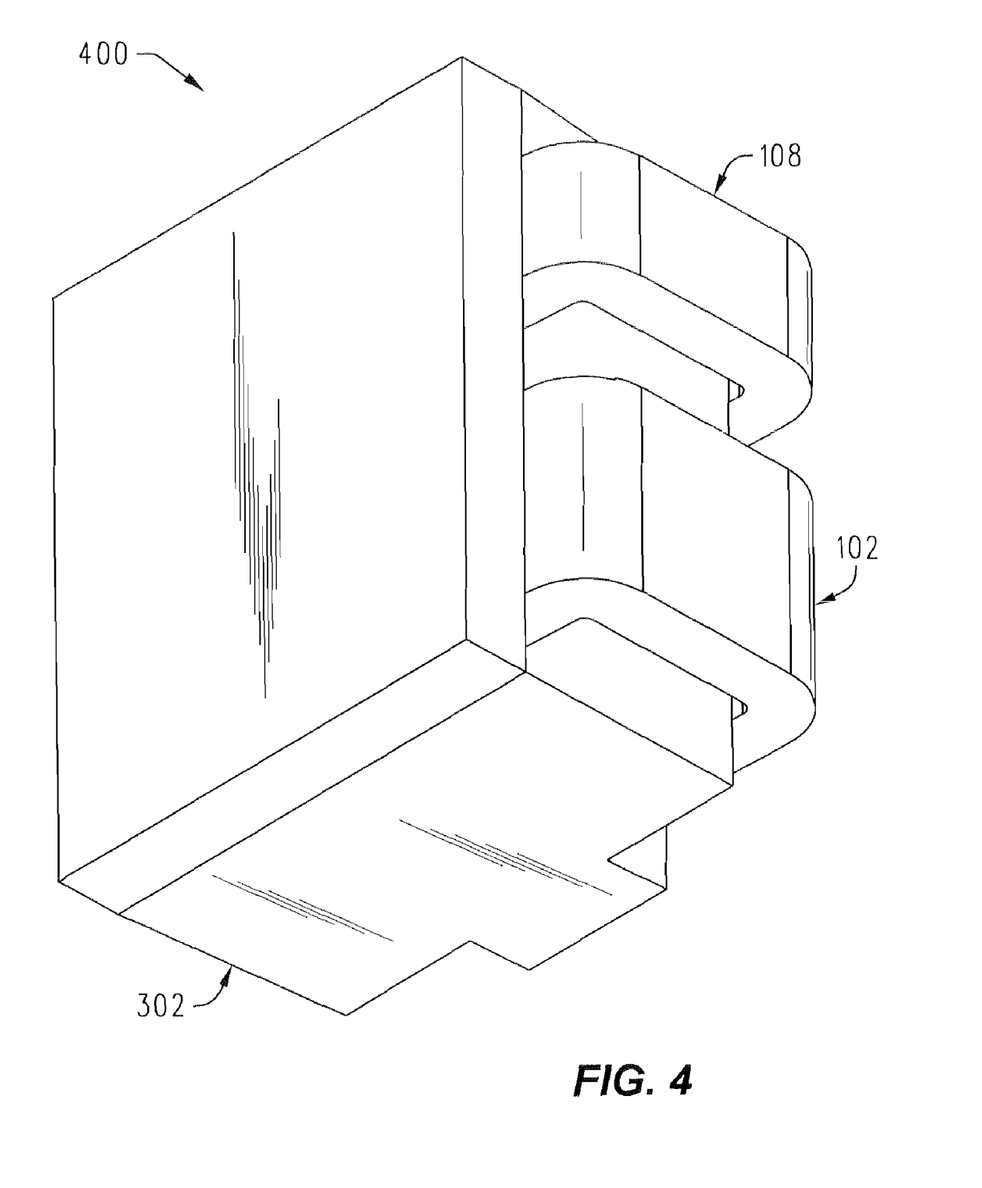
FIG. 4 is an isometric drawing of a LFCC (Lead Frame Chip Carrier) package in accordance with an exemplary embodiment of the invention.

FIG. 4 is an isometric drawing of a LFCC package 400 in accordance with an exemplary embodiment of the invention. The first 102 and third 108 lead frames in this drawing are shown as part of the LFCC package 400. An optical lens (not shown) may be added to this LFCC package 400. The material used as an encapsulant 302 includes but is not limited to epoxy, silicone, a hybrid of silicone and epoxy, amorphous polyamide resin or fluorocarbon, glass and plastic.

Figure 5:
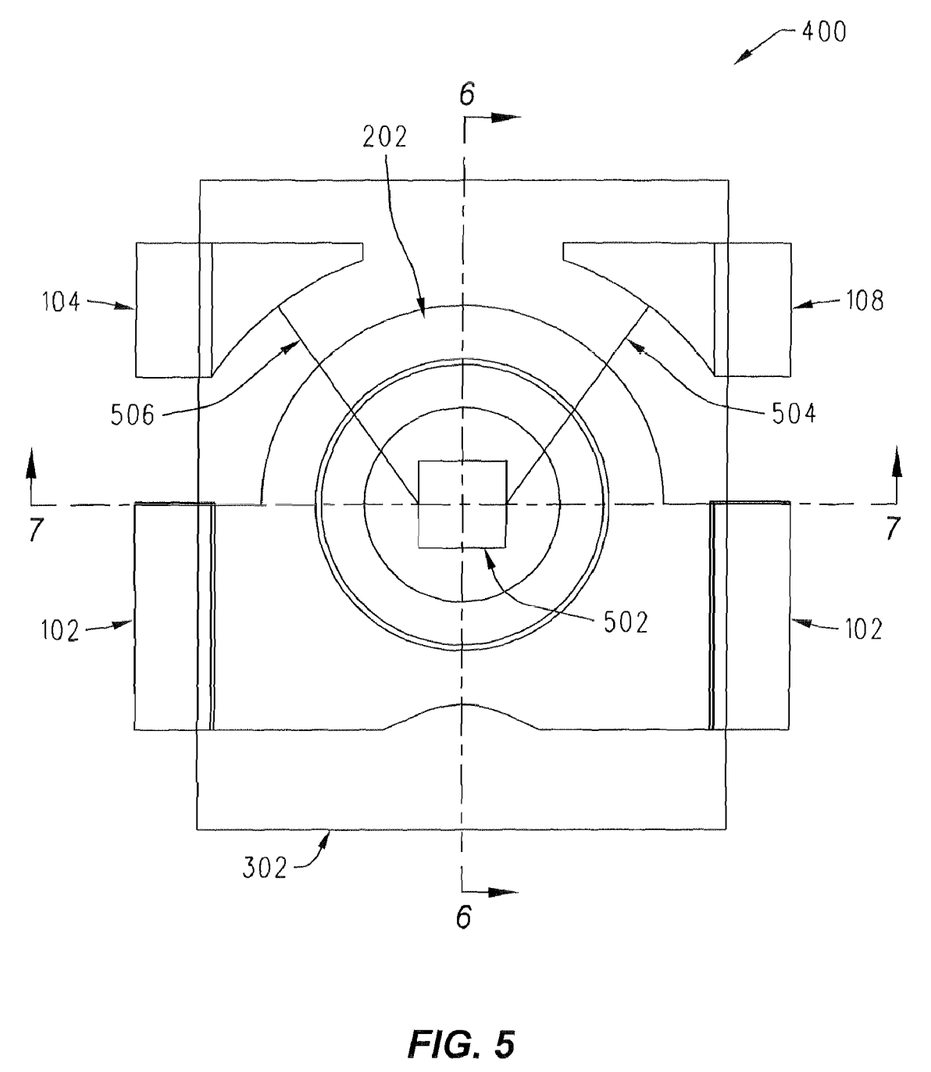
FIG. 5 is a top plan view of the LFCC (Lead Frame Chip Carrier) package in accordance with an exemplary embodiment of the invention.

FIG. 5 is a top plan view of the LFCC package 400 in accordance with an exemplary embodiment of the invention. The first 102, second 104 and third 108 lead frames in this drawing are shown as part of the LFCC package 400. Standard processes may be used to form the encapsulant 302. For example, injection molding, transfer molding and compression molding may be used to form the encapsulant 302. Lines 6 and 7 in FIG. 5 indicate where sectional views of the LFCC package 400 are made. These sectional views are discussed below.

FIG. 5 shows a wire bond 506 electrically connected to a light source 502 and the second lead frame 104. FIG. 5 also shows a wire bond 504 electrically connected to a light source 502 and the third lead frame 108. However other combinations of electrical connections may be used to power the light source 502.

For example, the light source 502 may be physically and electrically connected to the first lead frame 102 and electrically connected to the second lead frame 104 using a wire bond 506. In this example there would be no wire bond from the light source 502 and the third lead frame 108 (This example is not shown in FIG. 5). In another example, the light source 502 may be physically and electrically connected to the first lead frame 102 and electrically connected to the third lead frame 108 using a wire bond 504. In this example there would be no wire bond from the light source 502 and the second lead frame 104 (This example is not shown in FIG. 5).

Figure 6:
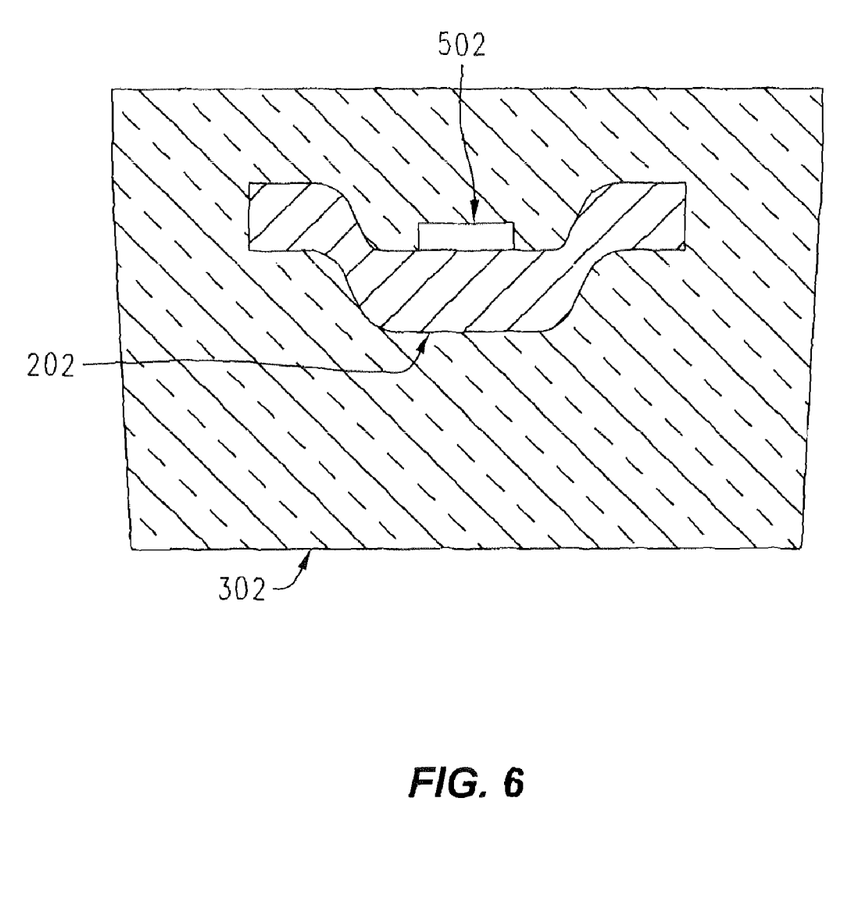
FIG. 6 is a sectional view of the LFCC (Lead Frame Chip Carrier) package shown in FIG. 5 in accordance with an exemplary embodiment of the invention.

FIG. 6 is a sectional view of the LFCC package 400 shown in FIG. 5 in accordance with an exemplary embodiment of the invention. In this sectional view, the reflector cup 202 is surrounded on four sides by the encapsulant 302. Because the encapsulant 302 covers four sides (208, 210, 212 and 106) of the reflector cup 202 and there is only a single encapsulant, there can be no CTE mismatch between the encapsulant 302 and a plastic structural body for example. Because there is no CTE mismatch between the encapsulant 302 and a plastic structural body, the occurrence of de-lamination between the light source 502 and the first lead frame 102 is less likely. Also, because the encapsulant 302 covers four sides (208, 210, 212 and 106) of the reflector cup 202 the occurrence of de-lamination between the light source 502 and the first lead frame 102 due to a CTE mismatch between the encapsulant 302 and any of the lead frames 102, 104 and 108, will be less likely.

Figure 7:
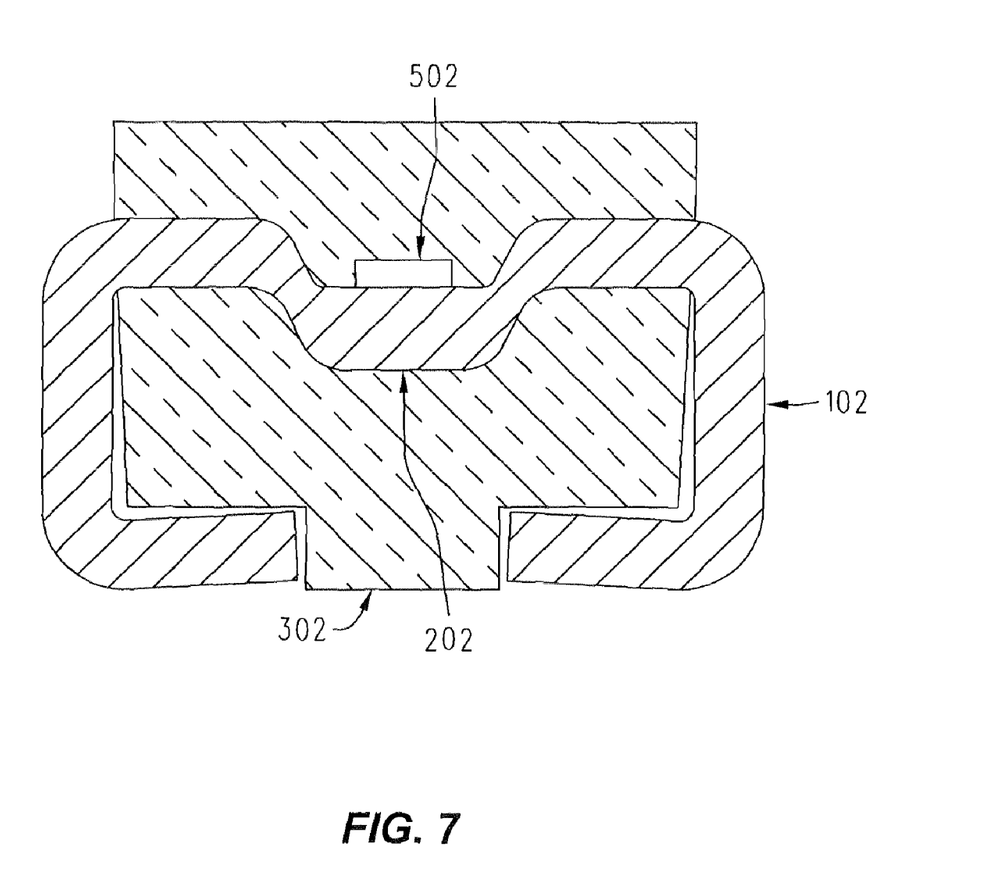
FIG. 7 is a sectional view of the LFCC (Lead Frame Chip Carrier) package shown in FIG. 5 in accordance with an exemplary embodiment of the invention.

FIG. 7 is a sectional view of the LFCC package 400 shown in FIG. 5 in accordance with an exemplary embodiment of the invention. This sectional view shows that the reflector cup 202 is surrounded on two sides by the encapsulant 302. This sectional view also shows a light source 502 physically connected at the bottom of the reflector cup 202. In this exemplary embodiment, the first lead frame does not provide an electrical connection. However, in another exemplary embodiment, the first lead frame 102 may provide an electrical connection for the light source 502 as well as leads for mounting.

In this exemplary embodiment, the second lead frame 104 and the third lead frame 108 are used as electrical connections to the light source 502. In this exemplary embodiment, the leads shown are J-leads; other leads such as SOJ leads, gull wing leads, reverse gull wing leads and straight cut leads may be used in other embodiments of this invention.

Figure 8:
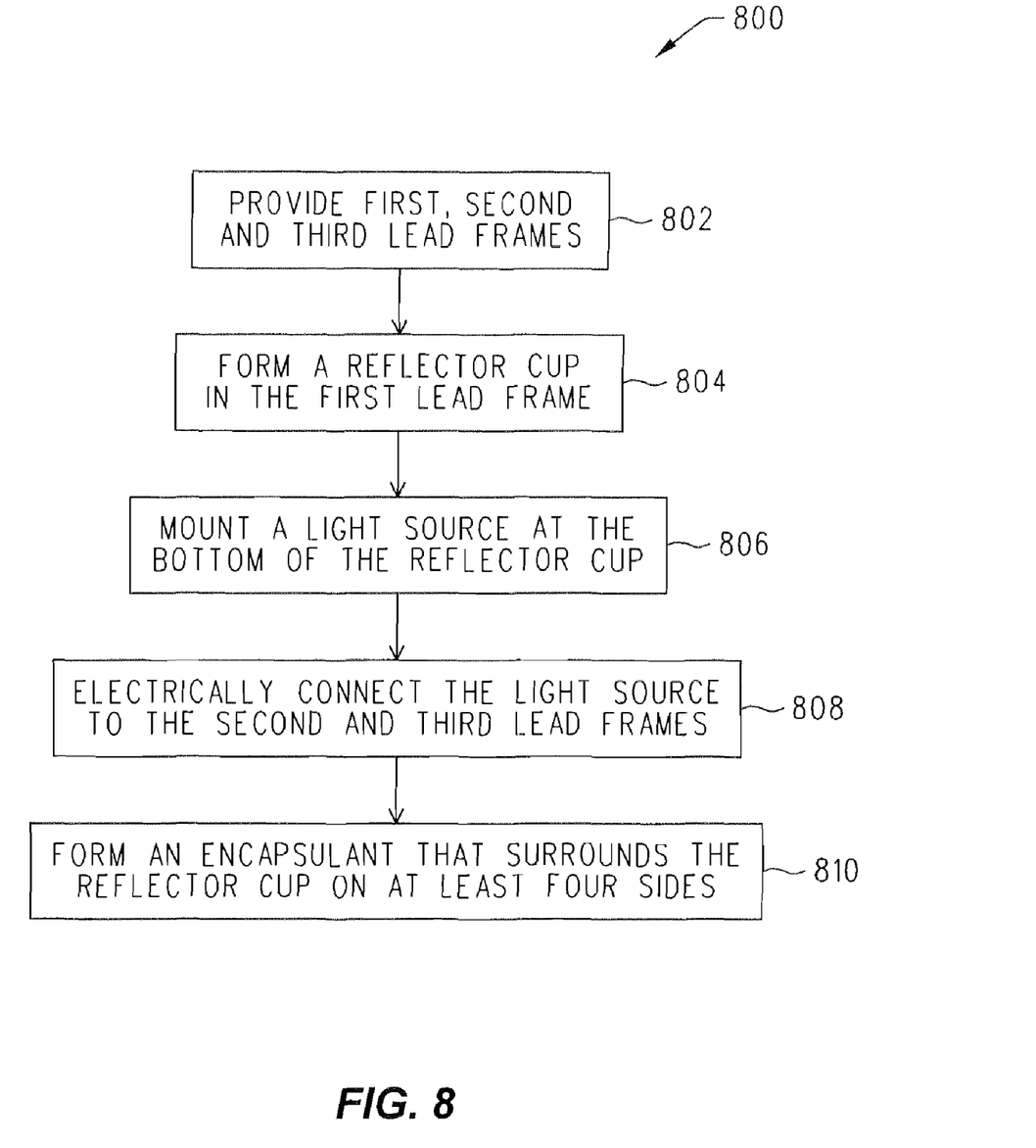
FIG. 8 is a process flow diagram of a method for making a LFCC (Lead Frame Chip Carrier) package using a single encapsulant in accordance with an embodiment of the invention.

FIG. 8 is a process flow diagram 800 of a method for making a LFCC package 400 using a single encapsulant 302 in accordance with an embodiment of the invention. In this exemplary embodiment, a first 102, a second 104 and a third 108 lead frame are provided as shown in box 802. Next as shown in box 804 a reflector cup 202 is formed in the first lead frame 102. For example, stamping the first lead frame 102 may be used to create a reflective cup 202.

Next as shown in box 806 a light source 502 is mounted at the bottom of the reflector cup 202. In this exemplary embodiment, the first lead frame is not used as an electrical connection to the light source 502. However, in another exemplary embodiment, the first lead frame 102 may provide an electrical connection for the light source 502. In this exemplary embodiment, the second lead frame 104 and third lead frame 108 are used as electrical connections to the light source 502.

Next as shown in box 808 electrical connections are made from the light source 502 to the second 104 and third 108 lead frames. In this exemplary embodiment, wire bonds 506 and 504 are used to make the electrical connection from the light source 502 to the second 104 and third 108 lead frames respectively.

Next as shown in box 810 an encapsulant 302 is formed that surrounds the reflector cup 202 on four sides (106, 208, 210 and 212). The encapsillant 302 also hermetically seals the light source 502. In this exemplary embodiment, the encapsulant 302 is an integral single piece structure.

The foregoing description has been presented for purposes of illustration and description. It is not intended to be exhaustive or to limit the invention to the precise form disclosed, and other modifications and variations may be possible in light of the above teachings. The exemplary embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A LFCC package comprising:
    a first lead frame comprising:
        a reflector cup incorporated within the first lead frame;
        a first tongue;
        a second tongue; and
        at least two leads;
    a second lead frame comprising:
        at least one lead;
    a third lead frame comprising:
        at least one lead;
    a light source;
    an encapsulant;
    wherein the first, the second and the third lead frames are attached to the encapsulant;
    wherein a bottom surface of the light source is physically attached at the bottom of the inside of the reflector cup of the first lead frame and wherein a top surface of the reflector cup of the first lead frame extends beyond a top surface of the light source;
    wherein the light source is electrically connected to the second lead frame and the third lead frame by wire bonds;
    wherein at least four sides of the reflector cup of the first lead frame are surrounded by the encapsulant, the encapsulant being an integral single piece structure.

2. The LFCC package of claim 1 wherein the light source is an LED.

3. The LFCC package of claim 1 wherein the light source is a semiconductor laser.

4. The LFCC package of claim 1 wherein the encapsulant includes a material selected from a group consisting of epoxy, silicone, a hybrid of silicone and epoxy, amorphous polyamide resin or fluorocarbon, glass and plastic.

5. The LFCC package of claim 1 wherein the encapsulant hermetically seals the light source.

6. The LFCC package of claim 1 wherein the first and second tongues are substantially rigid so as to reduce movement of the reflector cup, wherein the first and second tongues comprises at least one of J leads and SOJ leads and wherein the encapsulant at least partially fills a portion inside a bend of the first and second tongues.

7. The LFCC package of claim 1 wherein the leads of the first, second and third lead frames include leads selected from a group consisting of J leads, SOJ leads, gull wing leads, reverse gull wing leads and straight cut leads.

8. The LFCC package of claim 1 wherein the first lead frame comprises a bent piece of metal having a first major top surface, a second major bottom surface that opposes the first major top surface, a third side surface that abuts the first and second major top surface, and a fourth side surface that opposes the third side surface and also abuts the first and second major top surface, and wherein the at least four sides of the reflector cup that are surrounded by the encapsulant include at least a portion of the first major top surface, at least a portion of the second major bottom surface, at least a portion of the third side surface, and at least a portion of the fourth side surface.

9. The LFCC package of claim 1 wherein an optical lens is formed as an integral part of the encapsulant.

10. The LFCC package of claim 1 wherein the encapsulant has dimensions that conforms to the PLCC-4 standard.

11. A method of manufacturing a LFCC package, the method comprising:
    providing a first lead frame, the first lead frame comprising:
        a cavity defined in the first lead frame, the cavity at least partially establishing a reflector cup;
        a first tongue;
        a second tongue; and
        at least two leads;
    providing a second lead frame, the second lead frame comprising:
        at least one lead;
    providing a third lead frame, the third lead frame comprising:
        at least one lead;
    mounting a light source at a bottom of the reflector cup such that a top surface of the light source is positioned below a top surface of the reflector cup;
    electrically connecting the light source to the second lead frame and the third lead frame;
    forming an encapsulant that surrounds at least four sides of the reflector cup.

12. The method of claim 11 wherein the electrical connections between the light source and the second and the third lead frames are wire bonds.

13. The method of claim 11 wherein forming the encapsulant is selected from a group consisting of transfer molding, compression molding and injection molding.

14. The method of claim 11 wherein the reflector cup is formed by stamping the first lead frame.

15. The method of claim 11 wherein forming encapsulant includes forming the encapsulant such that the dimensions of the encapsulant conform to the PLCC-4 standard.

16. The method of claim 11 wherein the first and second tongues are substantially rigid so as to reduce movement of the reflector cup, wherein the first and second tongues comprises at least one of J leads and SOJ leads, and wherein the encapsulant at least partially fills a space inside a bend of the first and second tongues.

17. A device comprising:
    at least one LFCC package; the at least one LFCC package comprising:
    a first lead frame comprising:
        a reflector cup defined as a recess in the first lead frame;
        a first tongue;
        a second tongue; and
        at least two leads;
    a second lead frame comprising:
        at least one lead;

a third lead frame comprising:
  at least one lead;
a light source;
an encapsulant;
wherein the first, the second and the third lead frames are attached to the encapsulant;
wherein the light source is physically attached at the bottom of the inside of the reflector cup of the first lead frame and is positioned within the reflector cup of the first lead frame such that a top surface of the light source is below a top surface of the reflector cup of the first lead frame;
wherein the light source is electrically connected to the second lead frame and the third lead frame by wire bonds;
wherein at least four sides of the reflector cup are surrounded by the encapsulant, the encapsulant being an integral single piece structure.

18. The device of claim 17 wherein the leads of the first, second, and third lead frames includes leads selected from a group consisting of J leads, SOJ leads, gull wing leads, and reverse gull wing leads.

19. The device of claim 17 wherein an optical lens is attached to the at least one LFCC package.

20. The device of claim 17 wherein an optical lens is formed as an integral part of the encapsulant.

* * * * *